(12) United States Patent
Leng et al.

(10) Patent No.: US 12,130,700 B2
(45) Date of Patent: Oct. 29, 2024

(54) RAM TEST WITH PARITY ERROR DETECTION AND HANDLING

(71) Applicant: Hamilton Sundstrand Corporation, Charlotte, NC (US)

(72) Inventors: Qiuming Leng, South Barrington, IL (US); Billy J. Mordecai, Rockford, IL (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 0 days.

(21) Appl. No.: 18/177,336

(22) Filed: Mar. 2, 2023

(65) Prior Publication Data
US 2024/0296087 A1 Sep. 5, 2024

(51) Int. Cl.
| G06F 11/07 | (2006.01) |
| G11C 29/18 | (2006.01) |
| G11C 29/42 | (2006.01) |
| G11C 29/44 | (2006.01) |

(52) U.S. Cl.
CPC ...... *G06F 11/0793* (2013.01); *G06F 11/0775* (2013.01); *G11C 29/18* (2013.01); *G11C 29/42* (2013.01); *G11C 2029/4402* (2013.01)

(58) Field of Classification Search
CPC . G11C 29/42; G11C 29/18; G11C 2029/4402; G06F 11/0775; G06F 11/0793
See application file for complete search history.

(56) References Cited

U.S. PATENT DOCUMENTS

| 4,862,462 | A | 8/1989 | Zulian |
| 5,781,918 | A | 7/1998 | Lieberman et al. |
| 6,041,426 | A | 3/2000 | Qureshi |
| 6,332,181 | B1 | 12/2001 | Bossen et al. |
| 7,251,755 | B2 | 7/2007 | Joshi et al. |
| 8,467,914 | B2 | 6/2013 | Crane |
| 8,473,832 | B2 | 6/2013 | Wickeraad |
| 9,223,665 | B2 * | 12/2015 | Jeddeloh ............ G11C 29/4401 |
| 2005/0193288 | A1 * | 9/2005 | Joshi ................... G06F 11/0745 |
| | | | 714/E11.023 |
| 2012/0260138 | A1 * | 10/2012 | Downing, III ......... G11B 20/18 |
| | | | 714/723 |
| 2013/0223171 | A1 * | 8/2013 | Kim ..................... G11C 29/789 |
| | | | 365/200 |
| 2018/0293191 | A1 | 10/2018 | Li |
| 2019/0272211 | A1 * | 9/2019 | Colombo ............ G06F 11/0727 |

(Continued)

OTHER PUBLICATIONS

European Search Report on European Patent Application No. 24159195. 7-1211, mailed May 13, 2024; 12 pages.

*Primary Examiner* — Steve N Nguyen
(74) *Attorney, Agent, or Firm* — CANTOR COLBURN LLP (57) ABSTRACT

A computer system operates a method of detecting and handling a RAM parity error in the context of a RAM test. The computer system includes a memory storing therein a lookup table having a plurality of entries, each entry including a data location and a RAM parity error handler type. A processor obtains an address of a faulty byte detected during a RAM test on the parity RAM, searches the lookup table for an entry that contains the faulty byte based on the address of the faulty byte, obtains the RAM parity error handler type from the entry, and fixes a data field impacted by the faulty byte based on the RAM parity error handler type.

12 Claims, 6 Drawing Sheets

(56) References Cited

U.S. PATENT DOCUMENTS

| | | |
|---|---|---|
| 2020/0301776 A1 | 9/2020 | Cha |
| 2021/0265002 A1 | 8/2021 | Noguchi |
| 2021/0407555 A1* | 12/2021 | Bueb ................... G11C 16/10 |
| 2022/0237079 A1* | 7/2022 | Cariello ............ G06F 11/0793 |
| 2022/0336038 A1* | 10/2022 | Park ................... G11C 29/1201 |
| 2023/0185659 A1* | 6/2023 | Bao ..................... G06F 11/076 714/764 |

* cited by examiner

```
{
    402      404
    ↓        ↓
    {(void*)0x20000000, 0x3510,   REFRESH_FAULTY_BYTE,              NULL,    PNULL,   PNULL},
    {(void*)0x20003510, 0x1628,   FALLBACK_TO_DEFAULT_HANDLER,      NULL,    PNULL,   PNULL},
    {&SS8_1,            sizeof(SS8_1),   OVERWRITE_WITH_DEFAULT_VALUE, 0x12,    PNULL,   PNULL},
    {&SS8_2,            sizeof(SS8_2),   OVERWRITE_WITH_TIED_VARIABLE, NULL,    &SS8_1,  PNULL},
    {&SS16_1,           sizeof(SS16_1),  OVERWRITE_WITH_DEFAULT_VALUE, -0x1234, PNULL,   PNULL},
    {&SS16_2,           sizeof(SS16_2),  OVERWRITE_WITH_TIED_VARIABLE, NULL,    &SS16_1, PNULL},
    {&RequestCfifo1,    sizeof(RequestCfifo1), SPECIALIZED_HANDLER,    NULL,    PNULL,   &CfifoRamParityErrorHandler},
    {&RequestCfifo2,    sizeof(RequestCfifo2), SPECIALIZED_HANDLER,    NULL,    PNULL,   &CfifoRamParityErrorHandler},
    {&ProtectedQueue,   sizeof(ProtectedQueue), REFRESH_FAULTY_BYTE,   NULL,    PNULL,   PNULL},
    {&ST_State,         sizeof(ST_State), SPECIALIZED_HANDLER,         NULL,    PNULL,   &ST_StateMachine_Init},
    {&FD_Block,         0xDA58,           FALLBACK_TO_DEFAULT_HANDLER, NULL,    PNULL,   PNULL}
};
                                          ↑         ↑        ↑        ↑
                                         406       408      410      412
```

RAM TEST WITH PARITY ERROR DETECTION AND HANDLING

BACKGROUND

Embodiments of the present disclosure are related to RAM operations in computer systems and, more particular, to a system and method for detecting and handling RAM parity errors in the context of a RAM test.

A computer system may include a parity RAM that stores data bits, as well as parity bits which can be used to detect errors in data. Conventionally, RAM parity errors are handled using an RAM parity error interrupt handler routine implemented in a microprocessor. A parity fault line is connected to an interrupt input pin of the microprocessor. When a parity error occurs while reading the parity RAM, the parity fault line is asserted (i.e., a signal is sent over the parity fault line), which triggers a RAM parity interrupt at the microprocessor. The RAM parity error interrupt handler handles the parity error by either restarting the system or by halting the system, both of which result in a disruption of services. There is therefore a need to handle parity bit errors without having to restart/halt the computer system.

BRIEF DESCRIPTION

According to an embodiment, a method of detecting and handling a RAM parity error is disclosed. The method includes creating a lookup table with a plurality of entries, each entry including a data location and a RAM parity error handler type, obtaining an address of a faulty byte detected during a RAM test on the parity RAM, searching the lookup table for an entry that matches the faulty byte based on the address of the faulty byte, obtaining the RAM parity error handler type from the entry, and fixing a data field impacted by the faulty byte based on the RAM parity error handler type.

In addition to one or more of the features described above, wherein each entry further includes a RAM parity error handler associated with the RAM parity error handler type, the method further comprises obtaining the RAM parity error handler corresponding to the RAM parity error handler type and fixing the data field impacted by the faulty byte using the RAM parity error handler.

In addition to one or more of the features described above, the RAM parity error handler includes at least one of: (i) a default value; (ii) a tied variable; (iii) a faulty byte refresh; and (iv) a specialized RAM parity error handler.

In addition to one or more of the features described above, wherein the entry includes a size of a data field, the method further comprises searching the lookup table for the entry that matches the faulty byte based on the address of the faulty byte, the address and the size of the data field in the lookup table.

In addition to one or more of the features described above, the RAM parity error handler type in an entry of the lookup table is determined by a developer of the RAM parity error handler and is based on an application for which a data field in the entry is used.

In addition to one or more of the features described above, fixing the data field impacted by the faulty byte further comprises one of: (i) overwriting the faulty byte with a default value; (ii) overwriting the faulty byte with a tied variable; (iii) refreshing the faulty byte with a value read from the faulty byte; (iv) calling a specialized RAM parity error handler; and (v) use of a default RAM parity error handler.

In addition to one or more of the features described above, the RAM parity error handler type is one of: (i) OVERWRITE_WITH_DEFAULT_VALUE; (ii) OVERWRITE_WITH_TIED_VARIABLE; (iii) REFRESH_FAULTY_BYTE; (iv) SPECIALIZED_HANDLER; and (v) FALLBACK_TO_DEFAULT_HANDLER.

In addition to one or more of the features described above, the method further includes writing 0 to the faulty byte when the faulty byte is not found in the lookup table. The faulty byte is a padding byte between the data fields in this case.

According to another embodiment, a computer system is disclosed. The computer system includes a memory storing therein a lookup table, the lookup table having a plurality of entries, each entry including a data location and a RAM parity error handler type, and a processor configured to obtain an address of a faulty byte detected during a RAM test on the parity RAM, search the lookup table for an entry that contains the faulty byte based on the address of the faulty byte, obtain the RAM parity error handler type from the entry, and fix a data field impacted by the faulty byte based on the RAM parity error handler type.

In addition to one or more of the features described above, wherein each entry further includes a parity handler associated with the RAM parity error handler type, the processor is further configured to obtain the RAM parity error handler corresponding to the RAM parity error handler type and fix the data field impacted by the faulty byte using the RAM parity error handler.

In addition to one or more of the features described above, the RAM parity error handler includes at least one of: (i) a default value; (ii) a tied variable; (iii) a faulty byte refresh; and (iv) a specialized RAM parity error handler.

In addition to one or more of the features described above, the RAM parity error handler type in the lookup table is determined by a developer of the RAM parity error handler and is based on an application for which a data field in the entry is used.

In addition to one or more of the features described above, the processor is further configured to fix the data field impacted by the faulty byte by performing one of: (i) overwriting the faulty byte with a default value; (ii) overwriting the faulty byte with a tied variable; (iii) refreshing the faulty byte with a value read from the faulty byte; (iv) calling a specialized RAM parity error handler; and (v) use of a default RAM parity error handler.

In addition to one or more of the features described above, the RAM parity error handler type includes at least one of: (i) OVERWRITE_WITH_DEFAULT_VALUE; (ii) OVERWRITE_WITH_TIED_VARIABLE; (iii) REFRESH_FAULTY_BYTE; (iv) SPECIALIZED_HANDLER; and (v) FALLBACK_TO_DEFAULT_HANDLER.

In addition to one or more of the features described above, the processor is further configured to write 0 to the faulty byte when the faulty byte is not found in the lookup table. The faulty byte is a padding byte between the data fields in this case.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method are presented herein by way of exemplification and not limitation with reference to the Figures.

Figure 1:
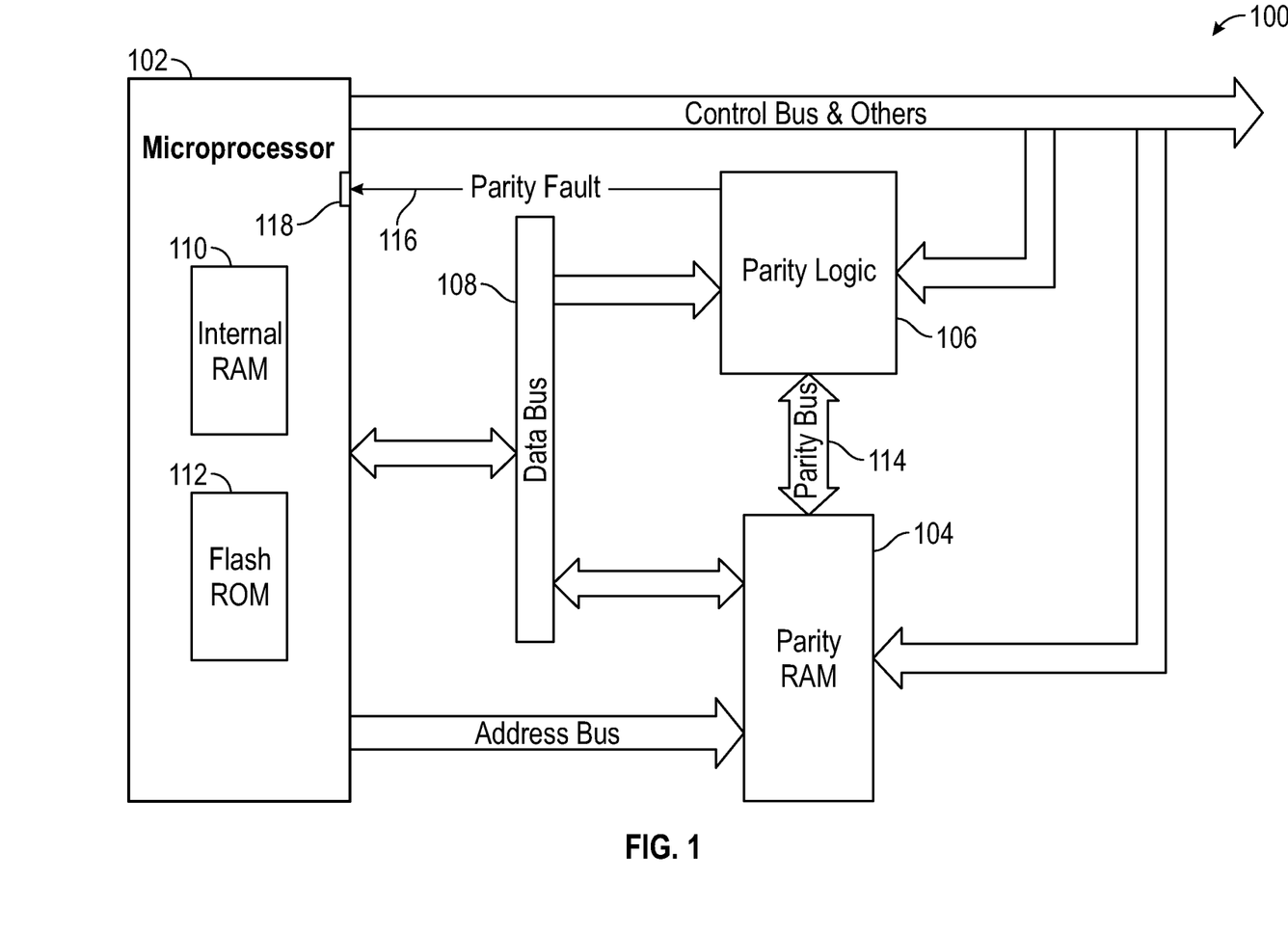
FIG. 1 shows a block diagram of a computer system in an illustrative embodiment.

With reference now to FIG. 1, a block diagram of a computer system 100 is shown in an illustrative embodiment. For ease of illustration, the block diagram only shows major components working with parity RAM and RAM parity handling. The computer system 100 includes a microprocessor 102, a parity RAM 104, a Parity Logic component (Parity Logic 106) and a data bus 108. The Parity Logic 106 includes a piece of hardware that performs the calculation and comparison of the parity bits to detect RAM parity error. The microprocessor 102 includes a flash ROM 110 and an internal RAM 112. The flash ROM 110 holds non-volatile instructions and data, such as software code for a RAM test, RAM parity error detection and handling, and a RAM parity error handling lookup table. The internal RAM 112 holds temporary data. To simplify the processing performed using the methods disclosed herein, memory used for variables specifically created for RAM testing and RAM parity detection and handling as well as stack memory are allocated in the internal RAM. Use of the internal RAM provides better protection than parity RAM. The microprocessor 102 reads/writes data from/to the parity RAM 104 through the data bus 108. The data bus 108 provides a data communication path to the microprocessor 102, the parity RAM 104 and the Parity Logic 106.

The Parity RAM 104 has Data Input/Output pins ($D_{i/o}$) and Parity Input/Output pins ($P_{i/o}$). The parity Input/Output pins are associated with the data Input/Output pins. Commonly, a $P_{i/o}$ is associated with eight $D_{i/o}$. For example, for a parity RAM with 8 $D_{i/o}$, a single $P_{i/o}$ is associated with the 8 $D_{i/o}$. For a parity RAM with 16 $D_{i/o}$, two $P_{i/o}$ are used, as follows: the first parity I/O pin $P_{0i/o}$ is associated with the first group of 8 data I/O pins (i.e., from $D_{0i/o}$ to $D_{7i/o}$) and a second parity I/O pin $P_{1i/o}$ is associated with a second group of 8 data I/O pins (i.e., from $D_{8i/o}$ to $D_{15i/o}$). For a parity RAM with 32 $D_{i/o}$, 4 $P_{i/o}$ are used, as follows: the first parity pin $P_{0i/o}$ is associated with the first group of 8 data I/O (i.e., from $D_{0i/o}$ to $D_{7i/o}$), the second parity pin $P_{1i/o}$ is associated with the second group of 8 data I/O (i.e., from $D_{8i/o}$ to $D_{15i/o}$), the third parity pin $P_{2i/o}$ is associated with the third group of 8 data I/O (i.e., from $D_{16i/o}$ to $D_{23i/o}$), and a fourth parity pin $P_{3i/o}$ is associated with a fourth group of 8 data I/O (from $D_{24i/o}$ to $D_{31i/o}$). Parity RAM with high numbers of data I/O pins have corresponding parity I/O pins following this same pattern.

A parity bus 114 runs between the parity RAM 104 and the Parity Logic 106. Parity Logic 106 is used to calculate and set parity bits on the parity bus 114 based on data bits from the data bus 108, or to verify parity bits received from Parity RAM 104 via the parity bus 114.

For a write procedure at parity RAM 104, Parity Logic 106 calculates parity bits based on data bits from the data bus 108 and outputs the calculated parity bits to the parity bus 114. The parity bits on the parity bus 114 are written into the parity RAM 104 along with their corresponding data bits on the data bus 108. For a read procedure at the parity RAM 104, the parity RAM 104 outputs data bits to the data bus 108 and parity bits to the parity bus 114. Parity Logic 106 calculates parity bits based on the data bits on the data bus 108 and compares the calculated parity bits with their corresponding parity bits on the parity bus 114.

A Parity Fault line 116 can be connected from Parity Logic 106 to an interrupt input pin 118 of the microprocessor 102. An interrupt can occur if a parity comparison fails while reading the parity RAM 104. In such instances, the Parity Fault line 116 is asserted by the Parity Logic 106, which triggers the interrupt at the microprocessor 102.

Figure 2:
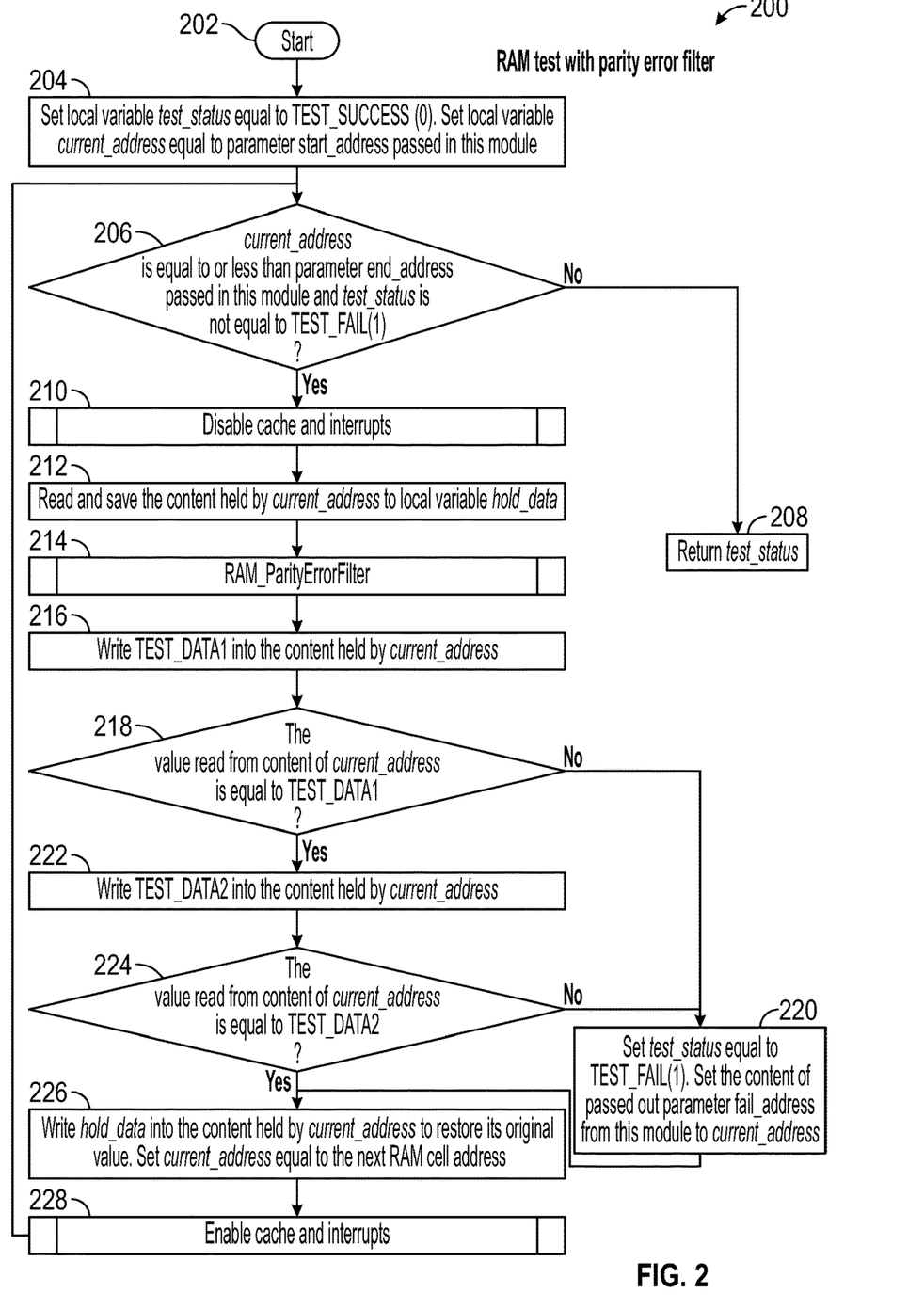
FIG. 2 shows a flowchart of a RAM test process with a "RAM_ParityErrorFilter" module, in an embodiment.

FIG. 2 shows a flowchart 200 of a RAM test process with "RAM_ParityErrorFilter" module, in an embodiment. As shown in FIG. 2, the RAM test provides an environment for the method of RAM parity error detection/handling disclosed herein.

Test data patterns TEST_DATA1 and TEST_DATA2 are used for the RAM test. Examples of rules to set TEST_DATA1 value and TEST_DATA2 value are detailed here. For an 8-bit RAM test, TEST_DATA1 is equal to binary 01010101 (or 0x55 in hexadecimal notation) and TEST_DATA 2 is equal to binary 10101010 (or 0xAA in hexadecimal notation. The sizes of TEST_DATA1 and TEST_DATA2 can be set according to the size of the RAM test (0x5555 and 0xAAAA, respectively, for a 16-bit RAM test, 0x55555555 and 0xAAAAAAAA, respectively, for a 32-bit RAM test, etc.)

During the RAM test process, cache and interrupts are disabled to ensure that the test is performed on RAM instead of on cache and to ensure that control does not switch to the interrupt handler in the middle of the RAM test while the RAM cell under test may be filled with a test value.

The RAM test begins in box 202 when the RAM Test process is called. In box 204, a local variable test status is initialized and is set to an initial value TEST_SUCCESS(0) and a local variable current address is set equal to Start_Address. In box 206, a test is run to determine whether to continue the RAM test or to end the RAM test. If the current adresss is greater than the End_Address or if test status is equal to TEST_FAIL(1), the method proceeds to box 208 in which the RAM test is ended and a test status is returned. Returning to box 206, if current address is less than or equal to the End_Address and test status is not equal to TEST_FAIL(1), the method proceeds to box 210.

In box 210, cache and interrupts are disabled. In box 212, the content of the RAM cell at current address is read and saved to a local variable hold data for temporary storage. In box 214, a RAM parity filter process is performed (i.e., a call is made to a RAM parity filter process, which is discussed in detail with respect to FIG. 3).

In box 216, TEST_DATA1 (e.g., 0x55555555 for a 32-bit RAM test) is written into the RAM cell at current address. In box 218, the content value of the RAM cell at current address is read and checked against TEST_DATAL. If the value is not equal to TEST_DATA1, the method proceeds to box 220. In box 220, test status is set to TEST_FAIL(1) and the content of a passed out parameter Fail_Address is set equal to current addresss. From box 220, the method proceeds to box 226.

Returning to box 218 if the value read from the RAM cell at current address is equal to TEST_DATA1, the method proceeds to box 222. In box 222, TEST_DATA2 (e.g., 0xAAAAAAAA for a 32-bit RAM test) is written into the RAM cell at current address. In box 224, the content value of the RAM cell at current address is read and checked against TEST_DATA2. If the value is not equal to TEST_DATA2, the method proceeds to box 220. Otherwise, the method proceeds to box 226.

In box 226, hold data is written back into the RAM cell at current address to restore its original value. The current address is then incremented to the next RAM cell address. In box 228, the cache and interrupts are enabled. From box 228, the method returns to box 206.

Figure 3:
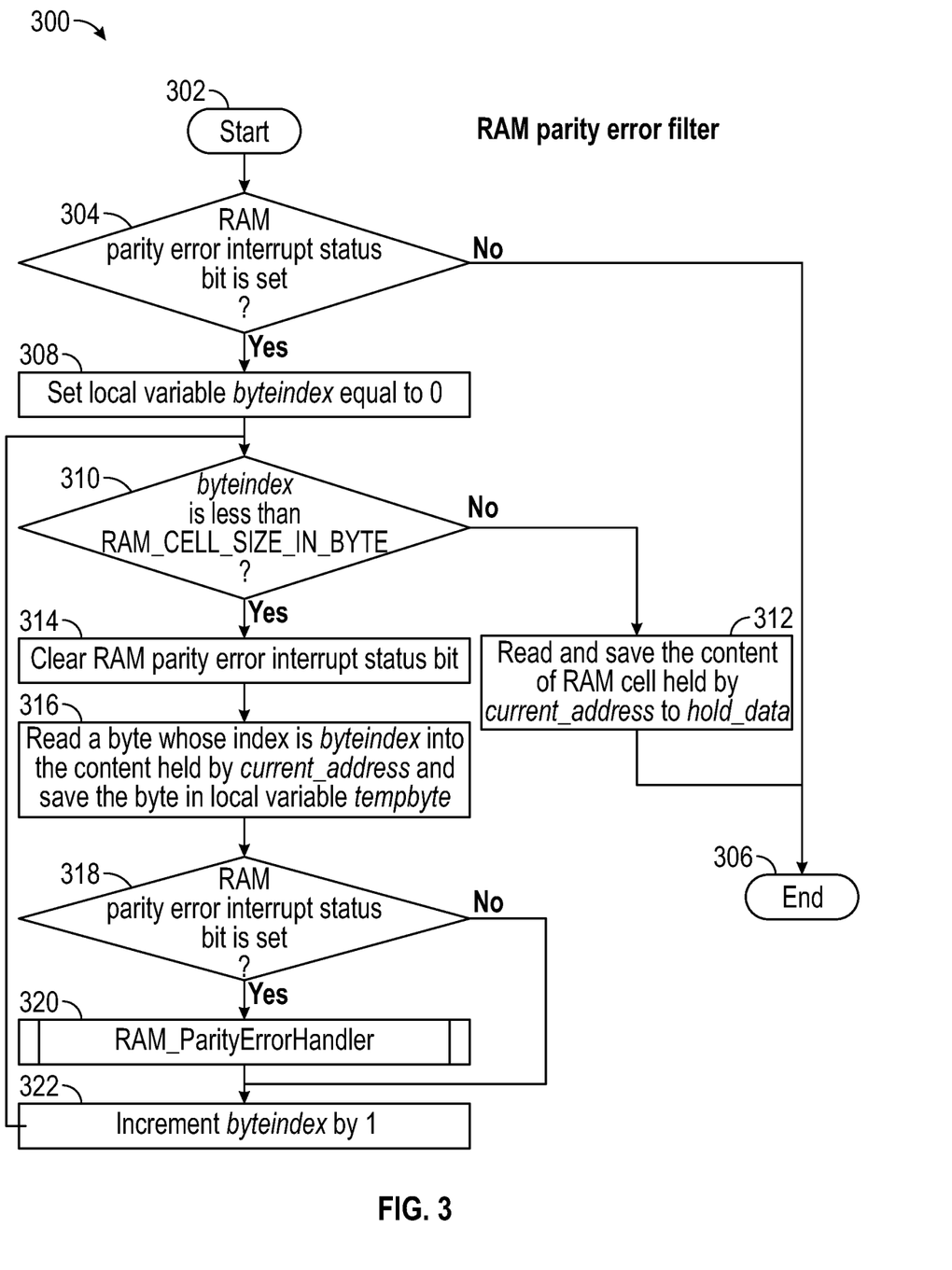
FIG. 3 shows a flowchart of a RAM parity filter process.

FIG. 3 shows a flowchart 300 of a RAM parity filter process. This process is called at box 214 of flowchart 200 (FIG. 2). Since the filter is being run while interrupts are disabled, control does not go to the RAM parity error interrupt handler if a RAM parity error occurs. When the Parity Fault line 116 is asserted (after a RAM cell with parity error is read), a RAM parity error interrupt status bit (i.e., the bit corresponding to the RAM parity error event in the microprocessor interrupt status register) is set to 1. If no RAM parity error is present in the RAM cell under test, the RAM parity error interrupt status bit is not set (i.e., read 0) and the process ends. If the RAM cell contains a parity error, the RAM parity error interrupt status bit is set to 1 and the filter checks each 8-bit data byte and its paired parity bit in the RAM cell and handles parity errors if present. In case of a parity error, the process ends when all the data bytes and parity bits in the RAM cell have been checked, the parity errors in the cell have been handled, and the content of the cell under test is read and saved to hold data.

The RAM parity filter process begins at box 302. In box 304, a check is performed on a RAM parity error interrupt status bit. If the RAM parity error interrupt status bit is not set, the method proceeds to box 306 in which the RAM parity filter procedure ends. Returning to box 304, if the RAM parity error interrupt status bit is set, the method proceeds to box 308.

In box 308, a local variable byteIndex is set equal to 0. In box 310, the byteIndex is compared to a value RAM_CELL_SIZE_IN_BYTE.

RAM_CELL_SIZE_IN_BYTE specifies the number of data bytes in a RAM cell under test. It may be set to 1 for an 8-bit RAM test, to 2 for a 16-bit RAM test, to 4 for a 32-bit RAM test, or to 8 for a 64-bit RAM test. If byteIndex is equal to or greater than RAM_CELL_SIZE_IN_BYTE, the method proceeds to box 312. In box 312, the contents of current address are read and saved to hold data. The method then proceeds to box 306 where the RAM parity filter method ends.

Returning to box 310, if byteIndex is less than RAM_CELL_SIZE_IN_BYTE, the method proceeds to box 314. In box 314, the RAM parity interrupt status bit is cleared (i.e., set to 0). In box 316, a byte whose index is byteIndex to the content of the RAM cell at the current address is read, and the byte is stored in local variable tempByte. In box 318, a check is performed on the RAM parity error interrupt status bit. If the RAM parity error interrupt status bit is not set (i.e., read 0), the method proceeds to box 322. In box 322, the byteIndex is incremented by 1. Returning to box 318, if the RAM parity error interrupt status bit is set, the method proceeds to box 320.

Figure 5:
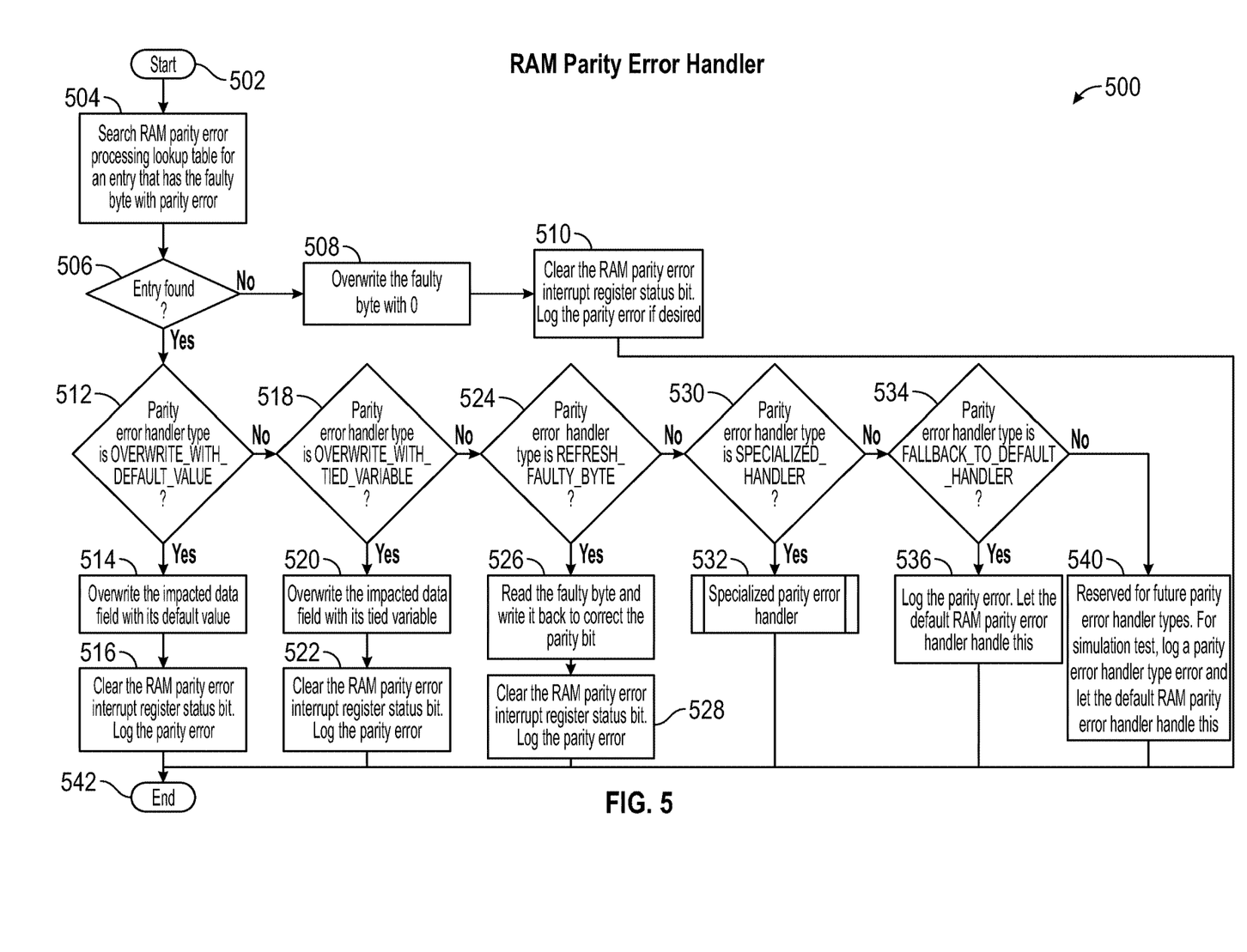
FIG. 5 shows a flowchart for the RAM parity error handler process, in an embodiment.

In box 320, a call is made to a RAM Parity Error Handler process, the contents of which are described with respect to FIG. 5. From box 320, the method proceeds to box 322, in which the byteIndex is incremented by 1. From box 320, the method returns to box 310.

Figure 4:
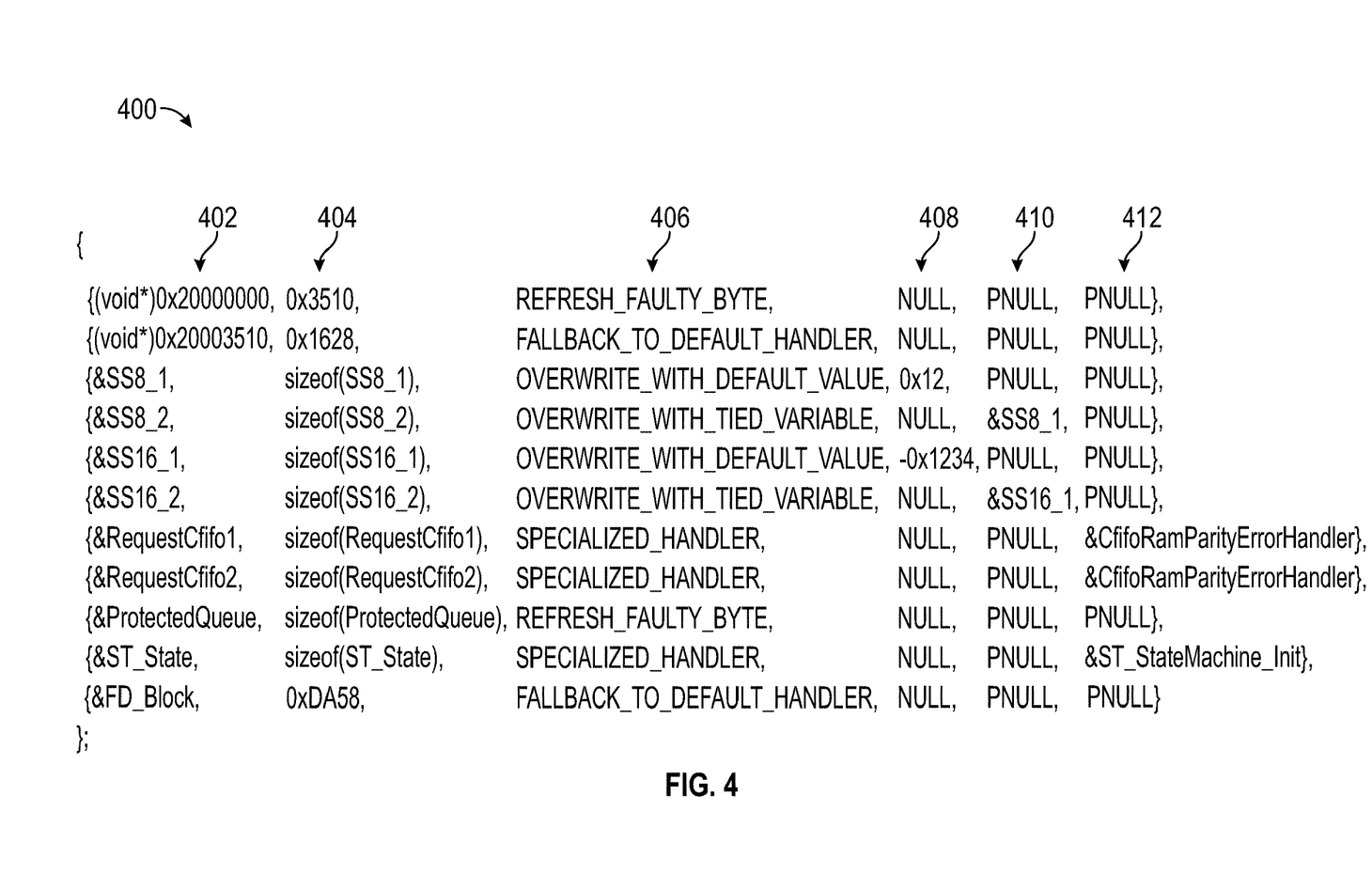
FIG. 4 is an example of a lookup table that can be used by the RAM Parity Error Handling process.

FIG. 4 is an example of a lookup table 400 that can be used by the RAM Parity Error Handler process of FIG. 5. The RAM Parity Error Handler process searches the lookup table 400 to find an entry whose data field includes a faulty byte (i.e., a byte with a parity error) and to handle the parity error based on a parity error handler type found in the lookup table. The lookup table 400 can include multiple RAM parity error handler types. It is understood the lookup table 400 is only an illustrative example. The selection of each RAM parity error handler type in the lookup table depends on how the data field in Parity RAM is used in the application. The lookup table can have any size, any number of RAM parity error handler types.

In an embodiment, The RAM parity error handler types may be collectively defined in the following enumeration data structure in C programming language.

typedef enum HDL_TPYE_ENUM
{
OVERWRITE_WITH_DEFAULT_VALUE=1,
OVERWRITE_WITH_TIED_VARIABLE,
REFRESH_FAULTY_BYTE,
SPECIALIZED_HANDLER,
FALLBACK_TO_DEFAULT_HANDLER
} HDL_TYPE;

A major data structure may be defined below in C programming language typedef struct RAM_ParityErrorHdlStruct
{
void *DataLocation; /* Start address of a data field */
unsigned int DataSize; /* Size of the data field */
HDL_TYPE ParityErrorHdlType; /* Parity error handler type */
int DefaultValue; /* Default value to set the data field */
void *TiedVariable; /* Tied variable used to set the impacted data
field */
void(*SpecializedParityErrorHandler)(void *errorPtr, void *dataPtr, unsigned
int size);
} RAM_ParityErrorHdlStruct;

In RAM_ParityErrorHdlStruct, SpecializedParityErrorHandler is a pointer pointing to a specialized parity error handler. Parameter errorPtr is a passed-in pointer, the address of the faulty byte. Parameter dataPtr is a passed-in pointer, the address of the data field impacted by the faulty byte. Parameter size is the size of the impacted data field.

Data structure HDL_TYPE and RAM_ParityErrorHdlStruct are used to build the lookup table 400 for the simulation test. The lookup table 400 includes columns for data address or location 402, a size of the data field 404, a RAM parity error handler type 406, a default value 408, an address of a tied variable 410 and a specialized parity error handler 412. As written in C language, the data address may be denoted by &(data field name) and its size by sizeof(data field name), as shown in the first column (location 402) and the second column (size of the data field 404) of the lookup table 400. NULL(0, meaning Not Apply), PNULL(0, meaning Not Apply) are used to fill most of fields DefaultValue, *TiedVariable and *SpecializedParityErrorHandler( ) that are not accessed by the RAM parity error handling procedures.

As shown in FIG. 4 for illustrative purposes, the first entry or row in the lookup table 400 is an entry for a merged data block used for a lab test and is inactive during normal operation. Thus, the RAM parity error handler type (e.g, REFRESH_FAULT_BYTE) is used to refresh the faulty byte when a parity error is detected within the data block. The second entry or row is another merged data block, left for the default RAM parity error handler in the simulation test. The third entry or row is for variable SS8_1, and it is overwritten with default value 0x12 if it contains a byte with parity error. The fourth entry or row is for variable SS8_2, and it is overwritten with variable SS8_1 if it contains a byte with parity error. The fifth and sixth entries are more examples for overwrite with default value and overwrite with a tied variable, respectively. The seventh entry (RequestCfifo1) and eighth entry (RequestCfifo2) are for circular FIFO, whose parity error is handled by a specialized handler (e.g., CfifoRamParityErrorHandler0). The ninth entry is for a ProtectedQueue whose parity error is handled by simply refreshing the faulty byte. The tenth entry is for ST_State, whose parity error is handled by reinitializing the ST state machine. The last entry is for FD_Block, another instance left for the default RAM parity error handler in the simulation test.

The lookup table 400 can be created by obtaining the data field name and address (column 1) from a software build map file. The data fields are normally sorted as per their memory addresses in the map file. If not sorted in the map file, they can be easily sorted using their numeric addresses from the map file before being used to populate the lookup table. A binary search method may be used to speed up the searching of the sorted lookup table. The lookup table can be assembled so with the start address and data block size for an entry in the lookup table with parity error handler type REFRESH_FAULTY_BYTE or FALLBACK_TO_DEFAULT_HANDLER.

Doing so reduces the number of entries in the lookup table and allows for a catch-all of names and sizes of the data fields in the data block.

FIG. 5 shows a flowchart 500 for the RAM parity error handler process, in an embodiment. How a RAM parity error is handled depends on the application for which the RAM byte is being used. For instance, a data variable with a faulty byte (short for byte with parity error in this disclosure) may be corrected using its tied data variable because it is periodically set by the tied data variable or is used to set the tied data variable. In another instance, a data variable with a faulty byte may be corrected and set to its default safe value, which is a similar technique used to set a corrupted parameter received in a communication system.

For data blocks, such as voice messages with error correction code in speech coding, the RAM parity error handler may refresh the faulty byte (i.e., read the faulty byte and write the read value back to the faulty byte in RAM) to get rid of the parity error and let a built-in error correction correct the faulty byte later. The RAM parity error handler may also refresh the faulty byte in an inactive RAM block, such as the RAM blocks used for certain tests that are inactive, and data in the RAM block is never used at the operation.

Specialized RAM parity error handlings may be used for some parity RAM applications. For instance, when a parity error occurs in a CFIFO (Circular-buffer-based FIFO) control field, it may make sense to reinitialize the CFIFO. When a parity error occurs in a CFIFO enqueued record, it may make sense to remove the faulty record from the CFIFO enqueued record list and set 0 to the faulty byte to clear the parity error with the faulty byte. When a parity error occurs in a CFIFO free record, the faulty byte may be set to 0 to clear the parity error with the faulty byte. For another instance of specialized RAM parity error handlings, when a parity error occurs in a critical data field of a component, it may make sense to reinitialize the component for the error recovery without restarting the system.

In another instance, a data variable with a faulty byte may be correct using a FALLBACK_TO_DEFAULT_HANDLER. This type allows flexibility and extensibility of RAM parity error handling. For example, a software release may include accurate RAM parity error handlings (overwrite with default value, overwrite with tied variable, refresh faulty byte and specialized handler types) for certain data fields and/or parity RAM blocks and leave the rest for the default RAM parity error handler, and future software releases may include accurate RAM parity error handlings for more data fields and/or parity RAM blocks.

The RAM parity error handler process begins at box 502 in FIG. 5. In box 504, the lookup table 400 is searched for an entry that has the faulty byte with the parity error based on the address of the faulty byte. In box 506, a decision is made based on whether the entry is found in the lookup table. If no entry is found, the method proceeds to box 508. In box 508, the faulty byte is overwritten with 0. In 510, the RAM parity error interrupt register status bit is cleared, and the parity error may be logged if desired. From box 510, the method proceeds to box 542 where the RAM parity error handler procedure ends.

Returning to box 506, if an entry is found in the lookup table, the method proceeds to box 512. In box 512, a check is made whether the RAM Parity Error Handler type is OVERWRITE_WITH_DEFAULT_VALUE. If the Parity Error Handler type is OVERWRITE_WITH_DEFAULT_VALUE, the method proceeds to box 514. In box 514, the impacted data field is overwritten with its default value. (For example, in the third entry of lookup table 400, the Parity Error Handler type is equal to OVERWRITE_WITH_DEFAULT_VALUE, and the default value is 0x12.) In box 516, the RAM Parity Error Interrupt Status bit is cleared the parity error may be logged. From box 516, the method proceeds to box 542 where the RAM parity error handler process ends.

Returning to box 512, if the RAM Parity Error Handler type is not OVERWRITE_WITH_DEFAULT_VALUE, the method proceeds to box 518. In box 518, a check is made on the Parity Error Handler Type. If the Parity Error Handler Type is equal to OVERWRITE_WITH_TIED_VARIABLE, the method proceeds to box 520. In box 520, the impacted data field is overwritten with its tied variable. (For example, in the fourth entry of lookup table 400, the Parity Error Handler type is equal to OVERWRITE_WITH_TIED_VARIABLE, and the tied variable is SS8_1.) In box 522, the RAM Parity Error Interrupt Status bit is cleared, and the parity error may be logged. From box 522, the method proceeds to box 542 where the RAM parity error handler process ends.

Returning to box 518, if the Parity Error Handler type is not OVERWRITE_WITH_TIED_VARIABLE, the method proceeds to box 524. In box 524, a check is made on whether the Parity Error Handler Type is equal to REFRESH_FAULTY_BYTE. If the Parity Error Handler Type is equal to REFRESH_FAULTY_BYTE, the method proceeds to box 526. In box 526, the faulty byte is read and written back to correct the parity bit. (For example, in the first entry of the lookup table 400, the RAM Parity Error Handler type is equal to REFRESH_FAULTY_BYTE.) In box 528, the RAM Parity Error Interrupt Status bit is cleared, and the parity error may be logged. From box 528, the method proceeds to box 542 where the RAM parity error handler process ends.

Returning to box 524, if the Parity Error Handler Type is not equal to REFRESH_FAULTY_BYTE, the method proceeds to box 530. In box 530, a check is made on whether the Parity Error Handler Type is equal to SPECIALIZED_HANDLER. If the Parity Error Handler Type is equal to SPECIALIZED_HANDLER, the method proceeds to box 532. In box 532, a call is made to a Specialized RAM Parity Error Handler process. Note the RAM parity error is fixed, the error logged, and the RAM parity error interrupt status bit cleared in the specialized RAM parity error handler. From box 532, the method proceeds to box 542 where the RAM parity error handler process ends.

Returning to box 530, if the Parity Error Handler Type is not equal to SPECIALIZED_HANDLER, the method proceeds to box 534. In box 534, a check is made on whether the Parity Error Handler Type is equal to FALLBACK_TO_DEFAULT_HANDLER. If the Parity Error Handler Type is equal to FALLBACK_TO_DEFAULT_HANDLER, the method proceeds to box 536. In box 536, the parity error may be logged. From box 536, the method proceeds to box 542 where the process ends. In this case, the RAM parity error handling falls back to the default RAM parity error handler, and the RAM parity error will be handled there.

Returning to box 534, if the RAM Parity Error Handler Type is not equal to FALLBACK_TO_DEFAULT_HANDLER, the method proceeds to box 540. Box 540 is reserved for possibly additional RAM parity error handler types to be added in the future. From box 534, the method proceeds to box 542 where the process ends.

Figure 6:
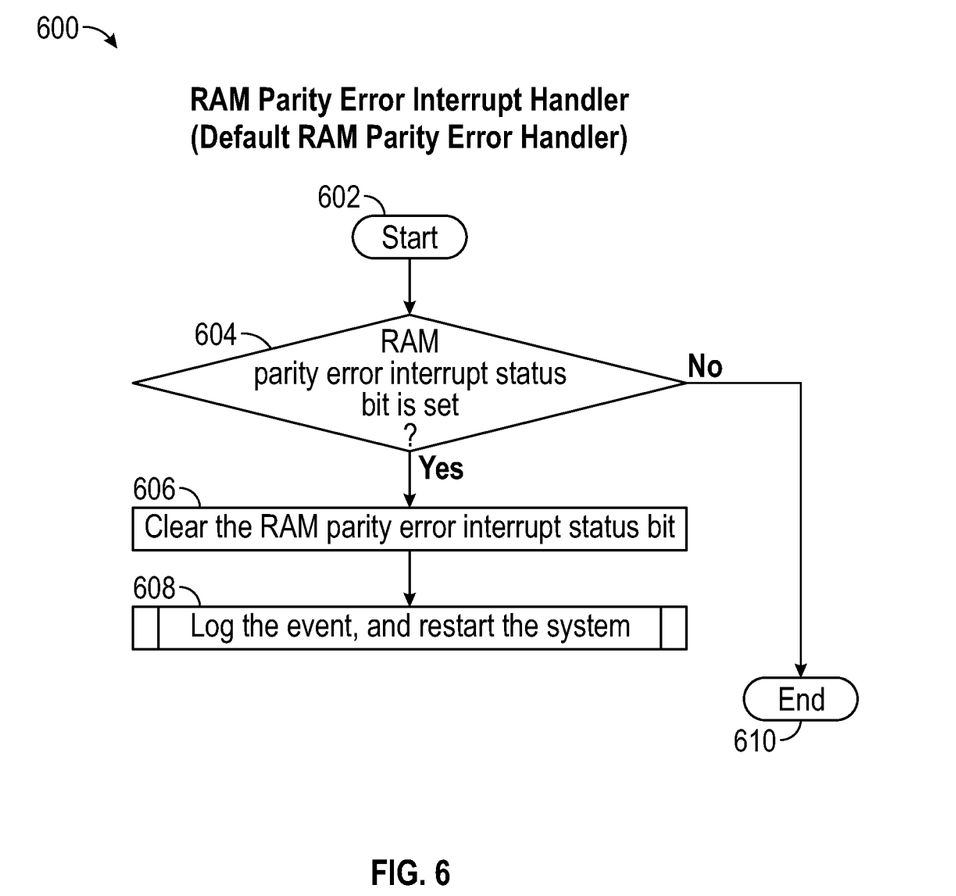
FIG. 6 shows a flowchart of a RAM Parity Error Interrupt Handler procedure used as a RAM parity error default handler in this disclosure, in an embodiment.

FIG. 6 shows a flowchart 600 of a RAM Parity Error Interrupt Handler procedure (It is also referred to herein as the default RAM parity error handler), in an embodiment. The RAM Parity Error Interrupt Handler procedure begins at box 602 when it is called.

In box 604, a check is made on the RAM Parity Error Interrupt Status bit. If the RAM Parity Error Interrupt Status bit is not set (i.e., read 0), the method proceeds to box 610, where the method ends. Otherwise in box 604, if the RAM Parity Interrupt Error Status bit is set (i.e., read 1), the method proceeds to box 606. In box 606, the RAM Parity Error Interrupt Status bit is cleared (i.e., is set 0). In box 608, the RAM parity error event is logged, and the system is restarted. Note that in box 608, a reset system call is performed, and the control never is sent to box 610.

The method disclosed herein runs in the context of a RAM test, detecting and handling RAM parity errors that occur in a RAM cell under test. The method runs only when there is a parity error with a RAM cell under test. Therefore, the method does not interfere with the RAM test in cases where there are no parity errors in the RAM cell under test.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A method of detecting and handling a RAM parity error, comprising:
    creating a lookup table with a plurality of entries, each entry including a data location of a data field, a size of the data field, and a RAM parity error handler type;
    obtaining an address of a faulty byte detected during a RAM test on the parity RAM;
    searching the lookup table for an entry that matches the faulty byte based on the address of the faulty byte, the data location of the data field, and the size of the data field;
    obtaining the RAM parity error handler type from the entry; and
    fixing a data field impacted by the faulty byte based on the RAM parity error handler type.

2. The method of claim 1, wherein each entry further includes a RAM parity error handler associated with the RAM parity error handler type, further comprising obtaining the RAM parity error handler corresponding to the RAM parity error handler type and fixing the data field impacted by the faulty byte using the RAM parity error handler.

3. The method of claim 2, wherein the RAM parity error handler includes at least one of: (i) a default value for the data field; (ii) a tied variable for the data field; and (iii) a faulty byte refresh.

4. The method of claim 1, wherein the RAM parity error handler type in an entry of the lookup table is determined by a developer of the RAM parity error handler and is based on an application for which a data field in the entry is used.

5. The method of claim 1, wherein fixing the data field impacted by the faulty byte further comprises one of: (i) overwriting the data field impacted by the faulty byte with a default value for the data field; (ii) overwriting the data field impacted by the faulty byte with a tied variable for the data field; (iii) refreshing the faulty byte with a value read from the faulty byte; and (iv) use of a default RAM parity error handler.

6. The method of claim 1, further comprising writing 0 to the faulty byte when the faulty byte is not found in the lookup table.

7. A computer system, comprising:
    a memory storing therein a lookup table, the lookup table having a plurality of entries, each entry including a data location of a data field, a size of the data field, and a RAM parity error handler type;
    a processor configured to:
    obtain an address of a faulty byte detected during a RAM test on the parity RAM;
    search the lookup table for an entry that contains the faulty byte based on the address of the faulty byte, the data location of the data field, and the size of the data field;
    obtain the RAM parity error handler type from the entry; and
    fix a data field impacted by the faulty byte based on the RAM parity error handler type.

8. The computer system of claim 7, wherein each entry further includes a parity handler associated with the RAM parity error handler type, and the processor is further configured to obtain the RAM parity error handler corresponding to the RAM parity error handler type and fix the data field impacted by the faulty byte using the RAM parity error handler.

9. The computer system of claim 8, wherein the RAM parity error handler includes at least one of: (i) a default value for the data field; (ii) a tied variable for the data field; and (iii) a faulty byte refresh.

10. The computer system of claim 7, wherein the RAM parity error handler type in the lookup table is determined by a developer of the RAM parity error handler and is based on an application for which a data field in the entry is used.

11. The computer system of claim 7, wherein the processor is further configured to fix the data field impacted by the faulty byte by performing one of: (i) overwriting the data field impacted by the faulty byte with a default value for the data field; (ii) overwriting the data field impacted by the faulty byte with a tied variable for the data field; (iii) refreshing the faulty byte with a value read from the faulty byte; and (iv) use of a default RAM parity error handler.

12. The computer system of claim 7, wherein the processor is further configured to write 0 to the faulty byte when the faulty byte is not found in the lookup table.

* * * * *